(12) United States Patent
Fujiishi et al.

(10) Patent No.: US 6,596,582 B2
(45) Date of Patent: Jul. 22, 2003

(54) METHOD OF MANUFACTURING A SEMICONDUCTOR DEVICE

(75) Inventors: Yoshitaka Fujiishi, Hyogo (JP); Yoshinori Tanaka, Hyogo (JP); Eiji Hasunuma, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/271,580

(22) Filed: Oct. 17, 2002

(65) Prior Publication Data
US 2003/0030095 A1 Feb. 13, 2003

Related U.S. Application Data

(62) Division of application No. 09/951,428, filed on Sep. 14, 2001, now abandoned.

(30) Foreign Application Priority Data

Mar. 5, 2001 (JP) ........................................ 2001-059654

(51) Int. Cl.$^7$ ......................................... H01L 21/8242
(52) U.S. Cl. .................. 438/253; 438/255; 438/398
(58) Field of Search ............................ 438/3, 240, 253, 438/254, 255, 396, 397, 398

(56) References Cited

U.S. PATENT DOCUMENTS

| | | | |
|---|---|---|---|
| 5,663,085 A | 9/1997 | Tanigawa | |
| 5,933,742 A * | 8/1999 | Wu | 438/398 |
| 5,972,748 A | 10/1999 | Itoh et al. | |
| 6,174,770 B1 * | 1/2001 | Chi | 438/255 |
| 6,187,623 B1 | 2/2001 | Hirota et al. | |
| 6,197,652 B1 | 3/2001 | Lin et al. | |
| 6,300,192 B1 | 10/2001 | Kim | |

FOREIGN PATENT DOCUMENTS

| | | |
|---|---|---|
| JP | 8-306882 | 11/1996 |
| JP | 11-111945 | 4/1999 |
| TW | 301042 | 3/1997 |

\* cited by examiner

*Primary Examiner*—Tuan H. Nguyen
(74) *Attorney, Agent, or Firm*—McDermott, Will & Emery

(57) ABSTRACT

There can be provided a semiconductor device having a rough surface to provide an increased capacitance of a capacitor and enhanced prevention of short-circuit between capacitors, and a method of manufacturing the same. The semiconductor device includes a plug interconnection penetrating an insulating film and connected to an underlying wiring, and a storage node having a lower portion overlying the insulating film and free of a rough surface, and connected to the plug interconnection, and an upper portion overlying the lower portion of the storage node without covering a side surface of the lower portion of the storage node, and having a rough surface.

3 Claims, 17 Drawing Sheets

METHOD OF MANUFACTURING A SEMICONDUCTOR DEVICE

This application is a divisional of application Ser. No. 09/951,428 filed Sep. 14, 2001, now abandoned.

BACKGROUND OF THE INVENTION

1. Field of the Invention

The present invention relates generally to semiconductor devices such as dynamic random access memories (DRAMs) having a capacitor and methods of manufacturing the same and particularly to those having a rough surface to increase the capacitance of a capacitor and also enhancing a margin preventing the short-circuit between capacitors.

2. Description of the Background Art

FIGS. 26–34 show a method of forming in a conventional DRAM an upper portion of a storage node of a stacked, cylindrical capacitor that has a rough surface. Note that an underlying region including a semiconducting active region, an underlying wiring and the like is not shown. In the conventional method of forming an upper portion of a storage node, initially, as shown in FIG. 26, a resist mask 103 is placed on an interlayer insulating film 101 formed of tetra-ethyl-ortho-silicate (TEOS) and a storage node contact hole 102 is thus opened in the interlayer insulating film. Then, resist 103 is ashed and thus removed. Then, as shown in FIG. 27, phosphorus doped amorphous silicon 104 is deposited to fill storage node contact hole 102. An underlying wiring and a storage node capacitor are connected by a plug interconnection of phosphorus doped amorphous silicon because phosphorus as a dopant can facilitate reduction in resistance and can readily be controlled. The amount of phosphorus doped is approximately 4 to $8 \times 10^{20}/cm^3$. The film has a thickness of approximately 0.1 to 0.2 μm, although it depends on the diameter of the storage node contact hole. Then, as shown in FIG. 28, the entire surface is anisotropically etched to remove the phosphorus doped amorphous silicon on the interlayer insulating film to leave the phosphorus doped amorphous silicon only in storage node contact hole 102. Then, a plug interconnection 104a is formed. Then, as shown in FIG. 29, a phosphorus doped, polycrystalline silicon film 105 is deposited and boro-phospho-tetra-ethyl-ortho-silicate (BPTEOS) 106 is then deposited. Phosphorus doped, polycrystalline silicon film 105 has a thickness of approximately 0.05 to 0.1 μm. Then, as shown in FIG. 30, a resist mask (not shown) is used to etch BPTEOS 106 to form a pattern 106a of a storage node 107. Then, a combination of the resist mask and BPTOES 106a etched as above is used as a mask to etch a phosphorus doped, polycrystalline silicon film 105 to form a lower portion 105a of the storage node. At this stage, storage nodes 107 partially formed are spaced by a spacing 110. The geometry between storage nodes 107 is similar to various holes etched, providing an opening wider as it approaches the top, i.e., tapering toward the bottom. Then, as shown in FIG. 31, a non-doped amorphous silicon film 108 is deposited to later configure an upper portion of the storage node. Storage nodes 107 once separated at the FIG. 30 step are connected together at the FIG. 31 step. Non-doped amorphous silicon film 108 has a thickness of approximately 0.05 μm. Then, to separate storage nodes 107 from each other, non-doped amorphous silicon film 108 has an entire surface anisotropically etched. Thus, the non-doped amorphous silicon film covering a top surface of geometry 106a of the storage node is also etched away and BPTEOS 106a is exposed (FIG. 32). Furthermore, the non-doped amorphous silicon film covering interlayer insulating film 101 between the storage nodes is also etched away, TEOS 101 of the interlayer insulating film is exposed, and storage nodes 107 are separated from each other by a spacing 110a (FIG. 32). Then, vapor-phase HF is employed to selectively etch BPTEOS 106a filling the cylindrical, non-doped amorphous silicon. Thus a framework 108a of an upper, cylindrical portion of the storage node is formed.

As micro-fabrication technology further advances, cylindrical surface areas cannot provide a capacitor with a sufficient capacitance and accordingly there is a demand for further increased surface areas. To satisfy the demand, the cylindrical surface as described above is roughened to provide an increased capacitance to accommodate micro-fabrication. A conventional process for providing a rough surface employs a method of selectively roughening a cylindrical surface. In this method, $Si_2H_6$ is initially introduced into a vacuum of approximately 700° C. and $10^{-6}$ to $10^{-8}$ Torr and an intermediate product obtained at the FIG. 33 stage is placed in the flow of $Si_2H_6$ for a predetermined period of time to allow a silicon seed to adhere to the cylinder of a storage node. $Si_2H_6$ can be introduced for a period of time adjusted to prevent the silicon seed from adhering to TEOS 101 of the underlying interlayer insulating film. This process exploits the fact that depending on what the silicon seed adheres to the silicon seed has different incubation periods of time and has a shorter incubation period when it adheres to silicon than to oxide film. Then the product is annealed at approximately 700° C. and the silicon seed adhering to the cylindrical, non-doped amorphous silicon receives silicon atom from non-doped amorphous silicon 8 and is thus grown to stick out from the surface. Since a protrusion is grown on the surface from the silicon seed adhering to the surface, recesses and protrusions result, as seen across the entire surface, to roughen the surface (FIG. 34). The silicon seed hardly adheres to any locations other than cylindrical, non-doped amorphous silicon 108a and the roughening is thus limited. Consequently, only cylindrical, non-doped amorphous silicon 108a has a surface selectively roughened to form upper portion 108b of the storage node having a rough surface.

If the storage node has upper portion 108b remaining as non-doped amorphous silicon, the capacitor depletes. To prevent this, the surface roughening process described above is followed by introducing $PH_3$ to dope the non-doped amorphous silicon with phosphorus; if phosphorus-doped amorphous silicon, rather than non-doped amorphous silicon, is initially used, the phosphorus contained therein would prevent silicon atom from moving, as desired, to provide a rough surface. On upper portion 108b of the storage node that has a rough surface are deposited a capacitance insulating film and a top electrode for a capacitor (a cell plate) to complete the capacitor. The above described capacitor, with a surface roughened, can have a substantially increased area to satisfy a need for increased capacitance associated with microfabrication.

However, as shown in FIG. 34, a silicon seed is also grown from non-doped amorphous silicon adhering to a side surface of a lower portion 105a of the storage node. Thus, storage node 107 has a short-circuit margin corresponding to a spacing 110b and thus hardly ensured, which facilitates short-circuit between storage nodes. This tendency is more significant as microfabrication further advances, and a reconciliation of providing a rough surface to provide an increased capacitance and ensuring a short-circuit margin between storage nodes is now an issue to be addressed.

SUMMARY OF THE INVENTION

The present invention contemplates a semiconductor device having a rough surface to increase a capacitor in capacitance and simultaneously enhancing a margin preventing short-circuit between capacitors, and a method of manufacturing the same.

In accordance with the present invention the semiconductor device includes: a plug interconnection penetrating an insulating film and connected to an underlying wiring; and a storage node having a lower portion overlying the insulating film and free of a rough surface, and connected to the plug interconnection, and an upper portion overlying the lower portion without covering a side surface of the lower portion, and having the rough surface.

Typically, storage nodes are spaced by an etched trench. As such, the storage node tends to be narrower at a lower portion, which is closer to the insulating film, and the storage node tends to be wider at an upper portion, which is further away from the underlying wiring. For a conventional capacitor a storage node has a lower portion with a side surface also roughened and an insufficient short-circuit margin is thus provided between storage nodes. In contrast, in the present invention a storage node can have a lower portion free of such a rough surface and thus allowing storage nodes to be spaced farther apart or have a short-circuit margin larger than conventional. Thus in a microfabricated semiconductor device a capacitor can be increased in capacitance and in addition storage nodes can be provided with a short-circuit margin larger than conventional. Note that the capacitor is formed of a dielectric film deposited on the upper portion of the storage node, and a film of a cell plate (a top electrode of the storage node) deposited thereon.

The storage node can have an upper portion provided with a rough surface and an underlying, lower portion free of such a rough surface, whether the upper portion is formed in a cylinder or a rod. If it is formed in the cylinder its internal and external surfaces are roughened and if it is formed in the rod then its surface would be roughened. As such, whether a capacitor is a stacked-type, cylindrical, rough-surface capacitor or a thick film-stacked capacitor, the capacitor can be provided with an increased capacitance and between capacitors a large-circuit margin can be obtained.

In the present semiconductor device the storage node can have the lower portion formed of polycrystalline silicon doped with an impurity.

The impurity-doped polycrystalline silicon has a surface hardly roughened as a silicon seed adhering thereto hardly receives silicon therefrom. Thus the storage node has a surface rougher at an upper portion than at a lower portion. As has been discussed above, adjacent storage nodes have their respective upper portions spaced farther apart than their respective lower portions. As such, short-circuit can be avoided more reliably by preventing the storage node from having a lower portion with a rough surface and thus a small short-circuit margin. As has been discussed above, adjacent storage nodes have their respective upper portions spaced farther apart and if an upper portion of the storage node has a surface rougher than a lower portion of the storage node the short-circuit margin is hardly affected.

In the present semiconductor device the storage node can have the lower portion formed of metal film.

With the storage node having a lower portion formed of metal film, if in roughening a surface the lower portion has a silicon seed adhering thereto the lower portion, free of silicon required for growth, could not provide a growth protruding laterally or toward a storage node adjacent thereto. Adjacent capacitors can thus be provided with a short-circuit margin further ensured than when a storage node has a lower portion formed of doped polycrystalline silicon. Furthermore, metal film is smaller in resistance and a low-resistance contact with an underlying wiring can be provided.

In the present semiconductor device the plug interconnection and the lower portion of the storage node can be formed of a single metal film.

Thus the plug interconnection and the lower portion of the storage node do not have an interface therebetween and they are also formed of metal film, which is lower in resistance than doped polycrystalline silicon. Thus a low-resistance contact with an underlying wiring can be provided. Furthermore, the plug interconnection and the lower portion of the storage node can be provided in a single film deposition apparatus at a time to reduce the number of process steps. More specifically, the steps of etching the plug interconnection back, chemical, mechanical polishing, and the like can be eliminated.

In the present semiconductor device the metal film composing the lower portion of the storage node or the plug interconnection can be of Ti/TiN/Ti.

The metal film of Ti/TiN/Ti allows the plug interconnection and the lower portion of the storage node to be readily provided by using existing equipment, have low resistance and have high stability both in fabrication and use.

In the present semiconductor device the plug interconnection and the lower portion of the storage node can be formed of polycrystalline silicon doped with an impurity.

Thus the plug interconnection and the lower portion of the storage node can have reaction stability superior to those of metal film in fabrication and use. Furthermore, the plug interconnection and the lower portion of the storage node can be provided in a single film deposition apparatus at a time to eliminate the steps for example of etching the plug interconnection back, chemically, mechanically polishing, and the like.

The present invention provides a method of manufacturing a semiconductor device including the steps of: providing a plug interconnection penetrating an insulating film formed to cover an underlying region including a semiconducting active region and an underlying wiring, to connect with the underlying wiring; providing on the insulating film a lower layer of a storage node connected to the plug interconnection; on the lower layer intact or on the lower layer with a predetermined pattern formed of an insulating film and arranged thereon, depositing an amorphous silicon film to be used to form an upper portion of the storage node; patterning both the amorphous silicon film and the lower layer and thereby forming on the insulating film the storage node having a lower portion and the upper portion; and roughening a surface of the amorphous silicon film forming the upper portion.

This ensures that the semiconductor device is provided with an increased capacitance of a capacitor and an increased short-circuit margin between adjacent capacitors. Furthermore, on the upper portion of the storage node that has a rough surface, as described above, a dielectric film can be deposited and thereon a film of a cell plate can be deposited to provide a capacitor.

In the present method, the step of depositing an amorphous silicon film includes forming a pattern of a rod on the lower layer and depositing the amorphous silicon film on the lower layer and the pattern, and the step of patterning and thereby forming includes removing the pattern and forming the upper portion in a form of a cylinder.

Thus a semiconductor device can be fabricated including a stacked-type, cylindrical, rough-surface capacitor increased in capacitance and short-circuit margin.

In the present method, the step of patterning and thereby forming includes the step of anisotropically etching away the amorphous silicon film covering an upper surface of the pattern of the rod, the amorphous silicon film covering the lower layer, and the lower layer covered with the amorphous silicon film, while leaving the amorphous silicon film covering a side surface of the pattern of the rod, and the step of removing the pattern of the rod having the upper surface exposed in the step of anisotropically etching, to form the upper portion formed of the amorphous silicon film provided in the form of the cylinder.

Thus, existing equipment can be used to precisely control the anisotropic etching step to prevent the storage node from having a lower portion with a rough surface, while allowing the storage node to have an upper portion provided with a rough surface. This ensures that a stacked-type, cylindrical, rough-surface capacitor has an increased capacitance and that adjacent capacitors also have an increased short-circuit margin therebetween.

In the present method, the step of forming a pattern of a rod includes providing a moisture-containing insulating film and patterning the moisture-containing insulating film in the rod, and the step of removing the pattern of the rod includes removing the moisture-containing insulating film through vapor-phase HF.

Vapor-phase HF only reacts with moisture-containing layers. Since phosphorus-containing BPTEOS contains moisture, vapor-phase HF can be employed to anisotropically etch only BPTEOS of a geometry corresponding to the upper portion of the storage node. Thus a significantly simple process can be used to form a cylindrical capacitor having internal and external surfaces contributing to providing an increased capacitance.

In the present method, the insulating film penetrated by the plug interconnection is a moisture-free, tetra-ethyl-ortho-silicate (TEOS) film and the insulating film forming the pattern of the rod is a moisture-containing, boro-phospho-tetra-ethyl-ortho-silicate (BPTEOS) film, and the step of removing the pattern of the rod includes removing the BPTEOS film through vapor-phase HF.

Vapor-phase HF can react only with moisture-containing layers and thus etch them. In BPTEOS a phase containing phosphorus contains moisture, whereas TEOS does not contain moisture. As such, vapor-phase HF reacts only with BPTEOS and etches the same. It does not react with the insulating film of TEOS exposed underlying the lower portion of the storage node and it reacts only with BPTEOS surrounded by cylindrical amorphous silicon and thus removes the same. Thus a stacked-type, cylindrical, rough-surface capacitor can readily be fabricated.

In the present method, the step of depositing the amorphous silicon film includes depositing the amorphous silicon film directly on the lower layer, the step of patterning and thereby forming includes etching away both the amorphous silicon film and the lower layer to form on the insulating film the storage node having the upper portion and the lower portion in the form of the rod.

Thus, existing equipment can be used to readily fabricate a semiconductor device including a thick film-stacked capacitor increased in capacitance and short-circuit margin.

In the present method a non-doped amorphous silicon film can be deposited in the step of depositing the amorphous silicon film.

Amorphous silicon is more effective than polycrystalline silicon in supplying a silicon seed adhering to a surface with silicon atoms to facilitate growth and thus roughen the surface. It is, however, less effective when it contains an impurity such as phosphorus. The non-doped amorphous silicon film used as the amorphous silicon film allows the storage node to have an upper portion provided with a surface significantly roughened to be more distinctively distinguished in roughness from a surface of the lower portion of the storage node free of such a rough surface. Thus if the lower portion of the storage node is formed of doped polycrystalline silicon it can be free of a rough surface while the upper portion of the storage node can be provided with a sufficiently rough surface to provide a large difference in roughness between the surfaces of the upper and lower portions of the storage node.

In the present method, the step of providing the plug interconnection includes depositing an impurity-doped polycrystalline silicon in a previously opened contact hole of the storage node, and the step of providing the lower layer includes subsequently, successively depositing the impurity-containing polycrystalline silicon, to provide the plug interconnection and the lower layer.

Thus the plug interconnection and the lower portion of the storage node can be free of any interface therebetween and a low-resistance contact with an underlying wiring can be provided. Furthermore, in providing the plug interconnection it is not necessary to provide for example the step of providing a deposition to fill a contact hole and then anisotropically etching an entire surface. This can reduce the number of process steps including the steps of etching the plug interconnection back, chemically mechanically polishing, and the like.

In the present method, the step of providing the plug interconnection includes depositing a metal film in a previously opened contact hole of the storage node, and the step of providing the lower layer includes subsequently, successively depositing the metal film, to provide the plug interconnection and the lower layer.

Thus the plug interconnection and the lower portion of the storage node can be free of any interface therebetween and metal film, smaller in resistance than doped polycrystalline silicon, can be used to provide a low-resistance contact with an underlying wiring. Furthermore, in providing the plug interconnection it is not necessary to provide for example the step of providing a deposition to fill a contact hole and then anisotropically etching an entire surface. Thus the number of process steps can be reduced.

In the present method the metal film deposited in at least one of the step of providing the plug interconnection and the step of providing the lower layer, is of Ti/TiN/Ti.

The metal film of Ti/TiN/Ti allows the plug interconnection and the lower portion of the storage node to be readily provided by using existing equipment, have low resistance and have high stability both in fabrication and use.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

With reference to the figures the embodiments of the present invention will now be described.

First Embodiment

Figure 1:
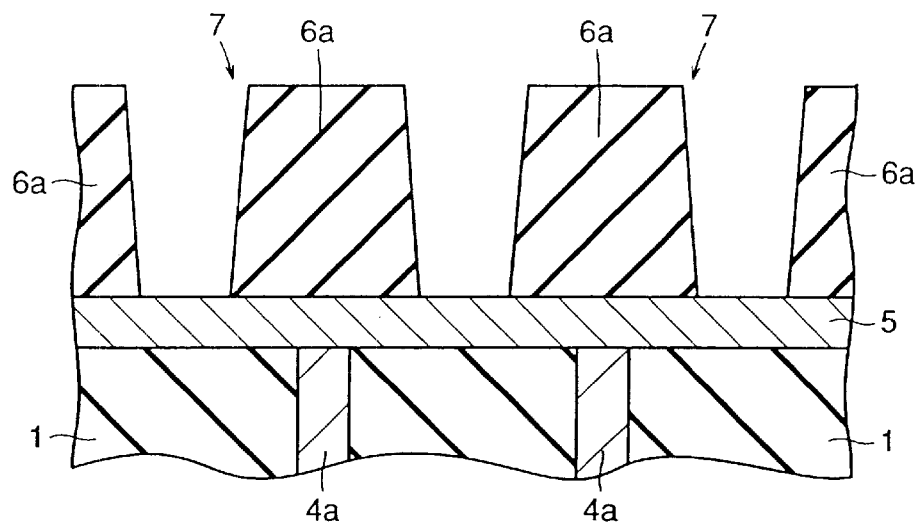
FIG. 1 is a cross section illustrating a method of manufacturing a semiconductor device in a first embodiment of the present invention, at the step of patterning a geometry of an upper portion of a storage node.
Figure 30:
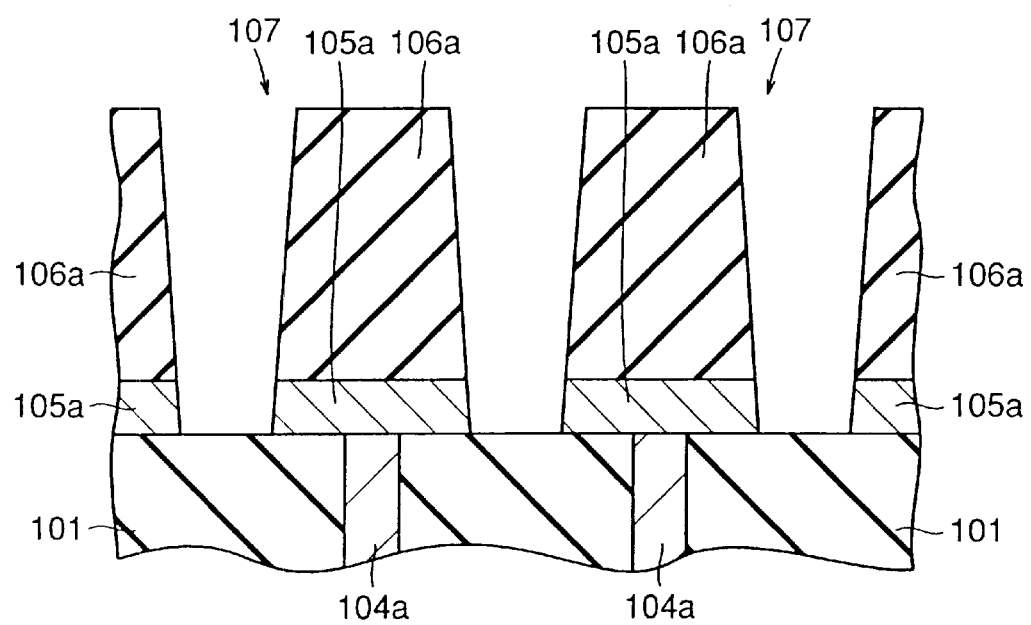
FIG. 30 is a cross section at the step of depositing BPTEOS in the FIG. 29 condition and patterning the BPTEOS and a lower portion of the storage node to form the storage node.
Figure 31:
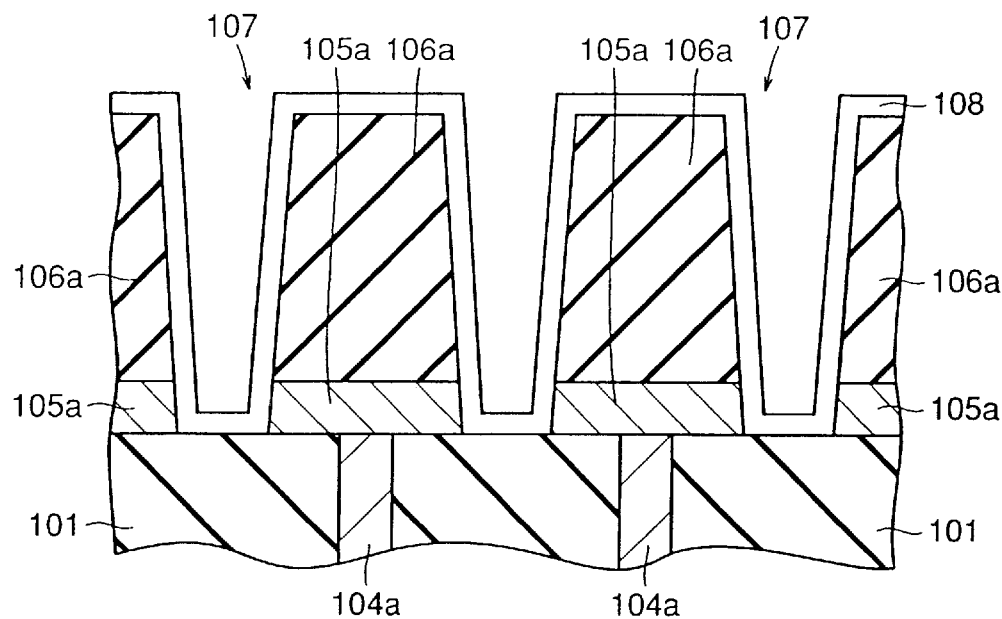
FIG. 31 is a cross section at the step of depositing non-doped amorphous silicon film in the FIG. 30 condition.
Figure 32:
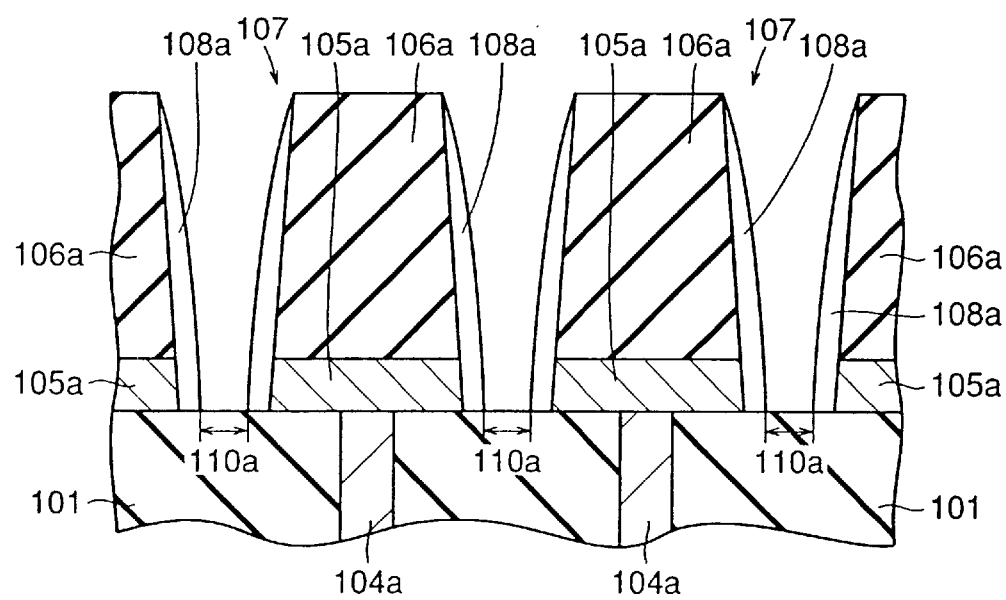
FIG. 32 is a cross section at the step of anisotropically etching an entire surface in the FIG. 31 condition.
Figure 33:
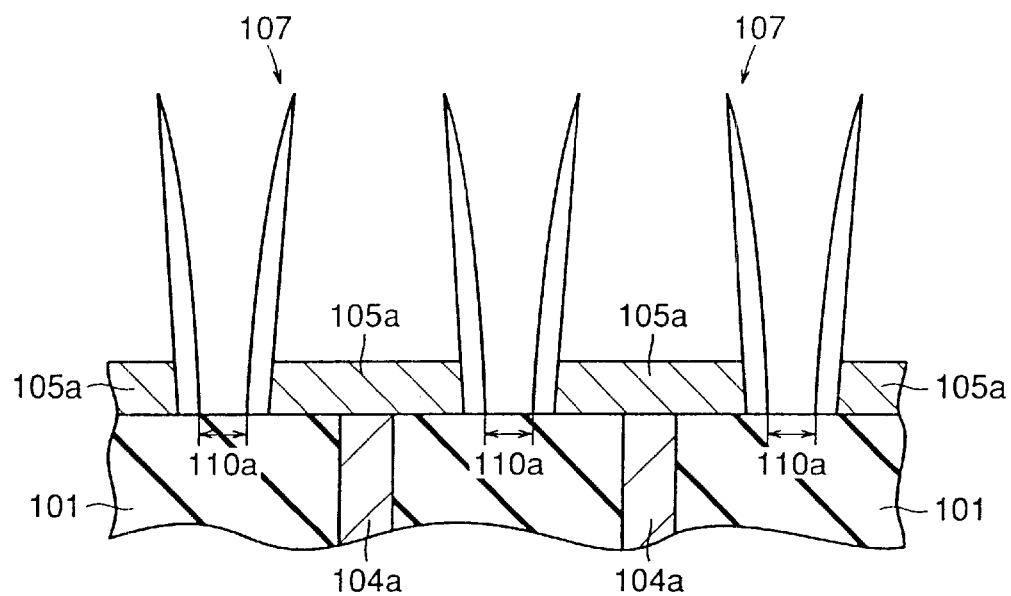
FIG. 33 is a cross section at the step of anisotropically etching the FIG. 32 condition to remove BPTEOS surrounded by a cylindrical upper portion of the storage node.
Figure 34:
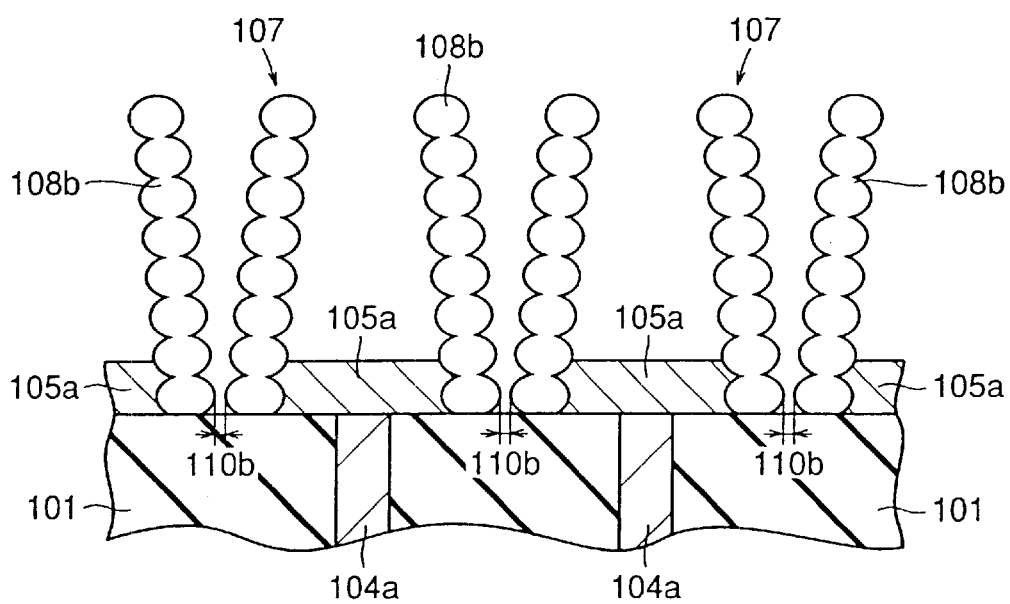
FIG. 34 is a cross section at the step of roughening in the FIG. 33 condition to allow only an upper portion of the storage node to have a rough surface.

FIGS. 1–6 illustrate a method of manufacturing a semiconductor device such as a DRAM in a first embodiment of the present invention. Initially an interlayer insulating film 1 is deposited on an underlying region (not shown) and then a contact hole for a storage node is bored. Then phosphorus-doped amorphous silicon film 4 containing approximately 4 to 8 $\times 10^{20}/cm^3$ of phosphorus is deposited to fill the contact hole. Then the phosphorus-doped amorphous silicon other than that existing at a plug interconnection is removed by anisotropically etching an entire surface of the phosphorus-doped amorphous silicon film on interlayer insulating film 1. Then a plug interconnection 4a is formed. Then a lower layer 5 of the storage node of phosphorus doped, polycrystalline silicon and an insulating, deposited layer 6 of BPTEOS are provided on interlayer insulating film 1 and plug interconnection 4a. Then, as shown in FIG. 1, a resist mask (not shown) is used to pattern BPTEOS 6 to form a geometry 6a of a pattern of an upper portion of the storage node. Conventionally, as shown in FIG. 30, a resist mask has been used to pattern geometry 6a of an upper portion of a storage node and the resist mask and BPTEOS 6a mask have been combined and thus used as a mask to pattern lower layer 5 of the storage node. In contrast, in the present embodiment at the FIG. 1 step, lower layer 5 of the storage node is not etched.

Figure 2:
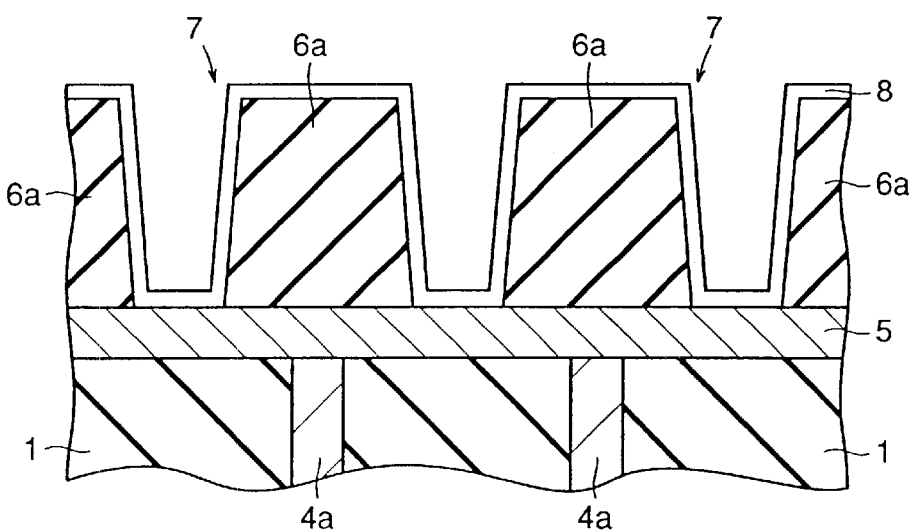
FIG. 2 is a cross section showing the step of depositing non-doped amorphous silicon film in the FIG. 1 condition.
Figure 3:
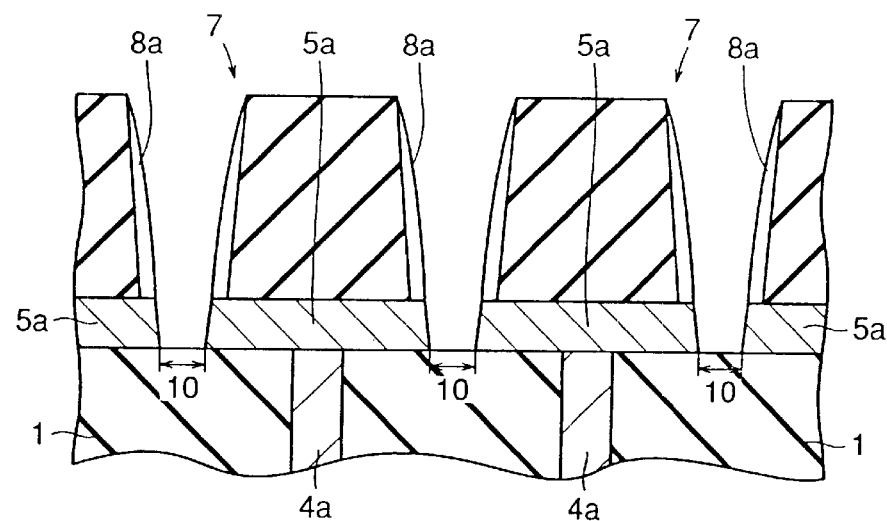
FIG. 3 is a cross section at the step of anisotropically etching an entire surface in the FIG. 2 condition.

Then, as shown in FIG. 2, exposed, phosphorus-doped, amorphous silicon 5 and geometry 6a of the upper portion of the storage node are covered by depositing non-doped, amorphous silicon film 8. Then, as shown in FIG. 3, non-doped amorphous silicon film 8 and doped polycrystalline silicon film 5 both have their respective entire surfaces anisotropically etched to leave only the non-doped amorphous silicon covering a side surface of pattern 6a of the upper portion of the storage node. The non-doped amorphous silicon is generally cylindrical in geometry and forms an upper portion 8a of the storage node. At this stage, storage node 7 formed of upper and lower portions are spaced from another storage node by a spacing 10. This can expose a side surface of a lower portion 5a of the storage node underlying an upper portion of the storage node. Spacing 10, serving as a short-circuit margin, thereafter substantially does not vary.

Figure 4:
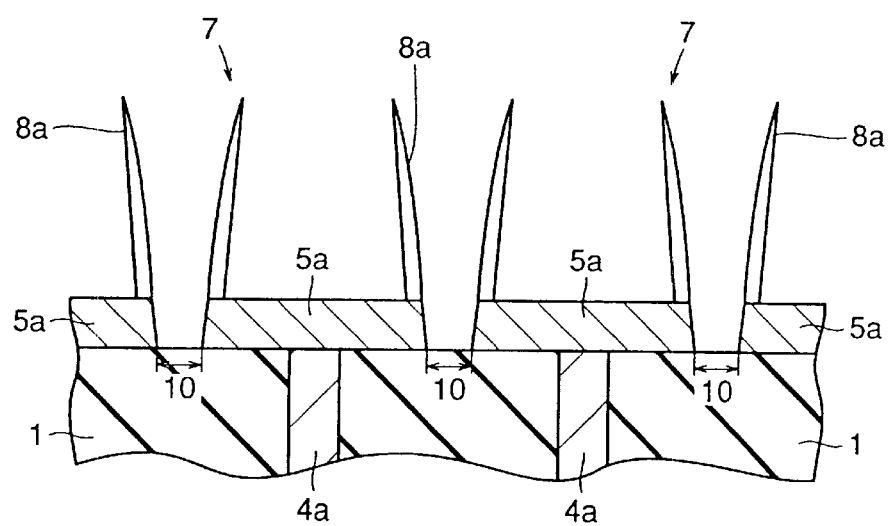
FIG. 4 is a cross section at the step of anisotropically etching in the FIG. 3 condition and removing BPTEOS surrounded by a cylindrical upper portion of a storage node.
Figure 5:
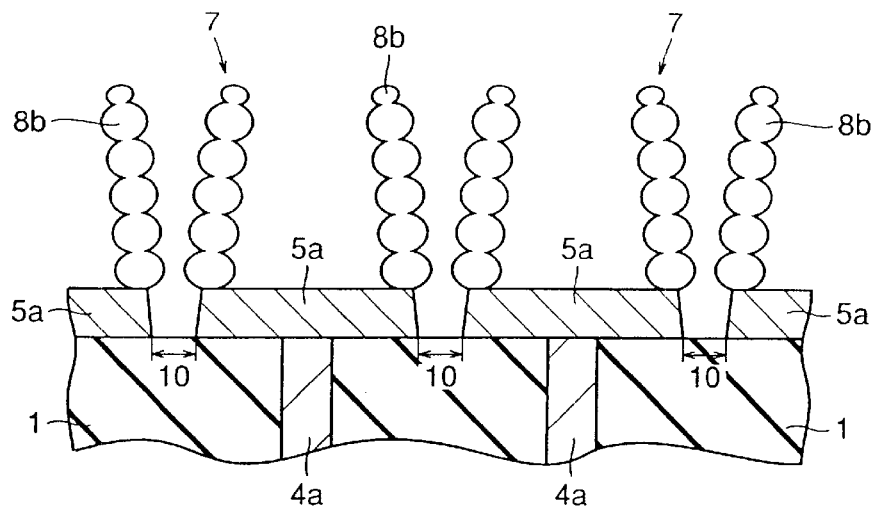
FIG. 5 is a cross section at the step of roughening a surface of the cylindrical upper portion of the storage node in the FIG. 4 condition.

Then, as shown in FIG. 4, vapor-phase HF is employed to etch BPTEOS 6a surrounded by cylindrical, non-doped, amorphous silicon 8a. In this etching step, underlying TEOS 1 forming the interlayer insulating film is not etched, since vapor-phase HF only reacts with a layer containing moisture and BPTEOS 6a containing phosphorus contains moisture whereas TEOS 1 does not contain moisture. Such a characteristic of vapor phase HF is used to etch only BPTEOS 6a away while leaving TEOS 1. Then, as shown in FIG. 5, only the non-doped amorphous silicon forming a framework of the upper portion of the storage node, is provided with a rough surface to form an upper portion 8b of the storage node, as follows: initially $Si_2H_6$ is introduced into a vacuum of approximately 70° C. and $10^{-6} \sim 10^8$ Torr and therein the intermediate product as shown in FIG. 4 is arranged for a predetermined period of time to adhere a silicon seed to a cylindrical surface of the upper portion of the storage node. Adjusting the time allowing $Si_2H_6$ to flow can prevent the silicon seed from adhering to underlying TEOS 1 of the interlayer insulating film. This process enjoys the fact that the silicon seed's incubation time varies with what the silicon seed adheres to and it is shorter on silicon than on oxide film. Then the intermediate product is annealed to allow silicon seeds adhering to the cylinder to receive silicon from non-doped amorphous silicon 8a and thus grow protruding from the surface outward. The silicon seeds are located on the surface dispersively and therefrom protrusions are provided on the surface dispersively. Thus, the surface as generally seen is rough. Any portions other than non-doped amorphous silicon 8a do not have a silicon seed and they thus do not have any growth. Thus only cylindrical non-doped amorphous silicon 8a selectively has a rough surface to provide an upper portion of the storage node that has the rough surface.

Phosphorus doped polycrystalline silicon 5a located under non-doped amorphous silicon 8b with a rough surface and having a side surface exposed, has its silicon hardly moving and thus hardly being grown. Thus the side surface of phosphorus doped polycrystalline silicon 5a of the lower portion the storage node hardly has a rough surface. By contrast, non-crystallized, non-doped amorphous silicon allows a silicon seed to rapidly and sufficiently receive silicon to provide a rough surface to allow a capacitor to have a substantially increased area, whereas the side surface of phosphorus-doped polycrystalline silicon 5a of the lower portion of the storage node hardly has a rough surface and storage nodes 7 have therebetween spacing 10 substantially unchanged to provide a better short-circuit margin than conventional. The film thickness of the portion to be provided with a rough surface is approximately 0.03 to 0.05 μm, although it depends on the condition(s). By adding those on opposite sides together, there can be obtained a short-circuit margin larger than conventional by approximately 0.06 to 0.1 μm.

Then, to prevent depletion of the exact non-doped amorphous silicon, the surface roughening process as described above is followed by introducing $PH_3$ to dope the non-doped amorphous silicon with phosphorus to limit the depletion thereof Doping the non-doped amorphous silicon with phosphorus is also desirable as the capacitor is required to have a bottom electrode having low resistance. Then, a capacitance insulation film and a cell plate (a top electrode for the capacitor) are deposited to complete the capacitor.

Figure 6:
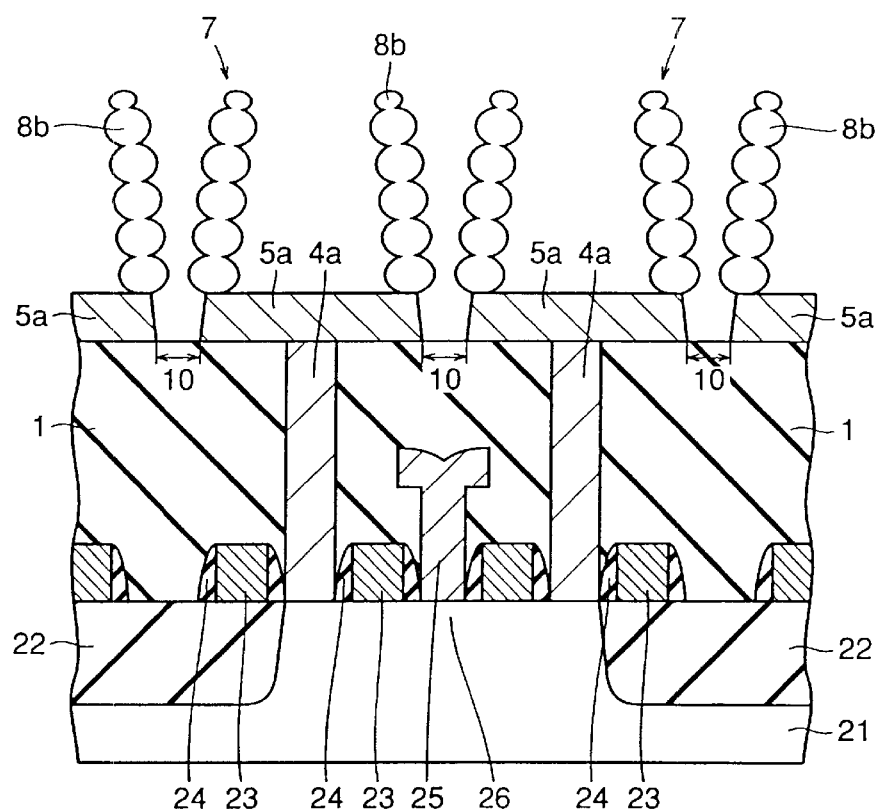
FIG. 6 is a cross section showing the upper portion of the storage node and an underlying wiring in the first embodiment.

FIG. 6 shows a semiconductor device with the capacitor as described above. A semiconductor substrate 21 has an active region in a region surrounded by a separating oxide film 22 and on the active region and the separating oxide film are arranged a bit line 25 and a word line 23 covered with a side wall oxide film 24. Bit line 25 is connected to the active region via a bit-line contact 26. The storage node has upper portion 8b connected to a predetermined active region or wiring via lower portion 5a of the storage node and plug interconnection 4a. When an underlying wiring with the plug interconnection connected thereto has a variation in voltage, the capacitor accordingly stores/discharges electric charge for example to hold digital information.

These microfabricated semiconductor devices that have the capacitor as described above can have both an increased capacitance attributed to a rough surface and an increased short-circuit margin between storage nodes 7.

Figure 7:
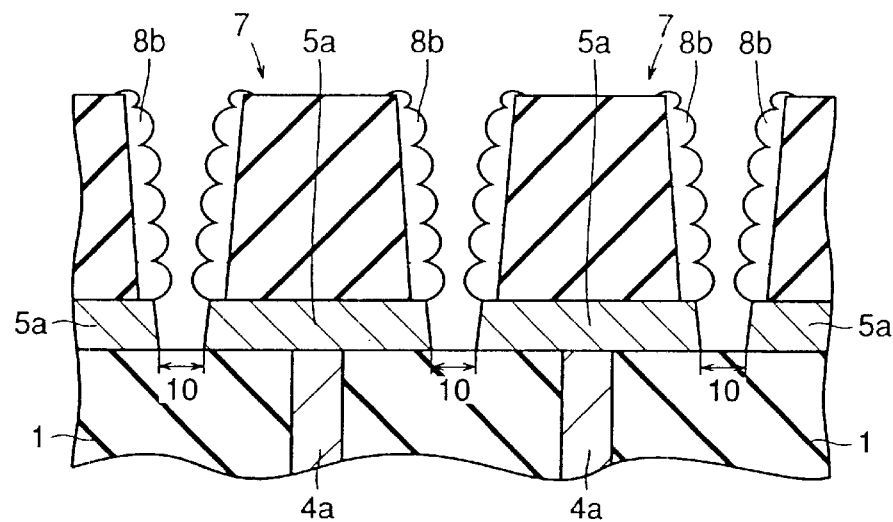
FIG. 7 is a cross section showing a variation of the first embodiment.

As a variation of the first embodiment the capacitor structure as shown in FIG. 7 can be exemplified. For this capacitor, BPTEOS 6a surrounded by cylindrical, non-doped amorphous silicon 8a, is not etched away. This structure can similarly provide an increased capacitance of a capacitor and an increased short-circuit margin. In this variation, as shown in FIG. 7, the cylinder can have only its outer surface roughened to provide the capacitor with an increased capacitance and the storage node having a lower portion free of a rough surface can have an increased short-circuit margin.

Second Embodiment

Figure 8:
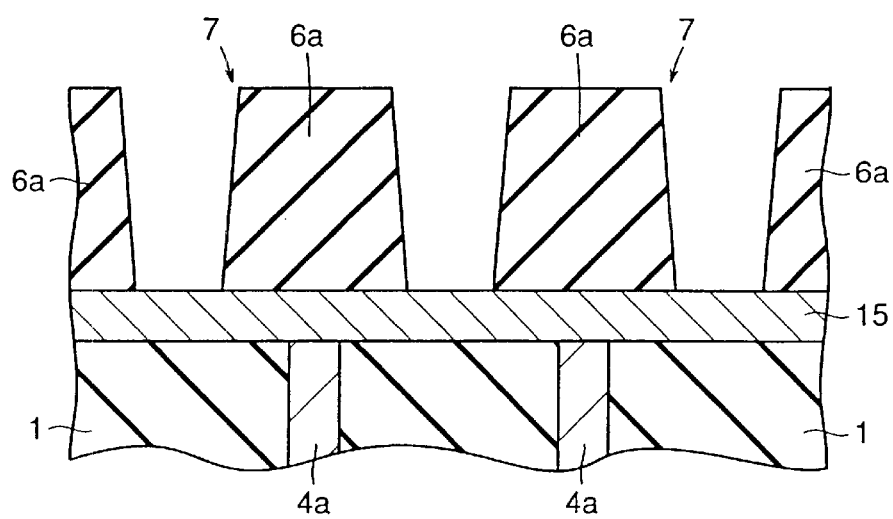
FIG. 8 is a cross section illustrating a method of manufacturing a semiconductor device in a second embodiment of the present invention at the step of patterning a geometry of an upper portion of a storage node on a lower layer of the storage node formed of metal film.

FIGS. 8–12 show a method of manufacturing a semiconductor device in a second embodiment of the present invention. FIG. 8 shows an intermediate product having a metal film 15 deposited as a lower layer of a storage node. The metal film can for example be Ti/TiN/Ti. With metal film 15 serving as the lower layer of the storage node) a resist mask (not shown) is used to etch only BPTEOS 6 away, as is in the first embodiment, to leave the metal film. As described above, conventionally a resist mask has been used to pattern BPTEOS 6 and the resist mask and BPTEOS 6a patterned have been combined and thus used as a mask to etch metal film 15.

Figure 9:
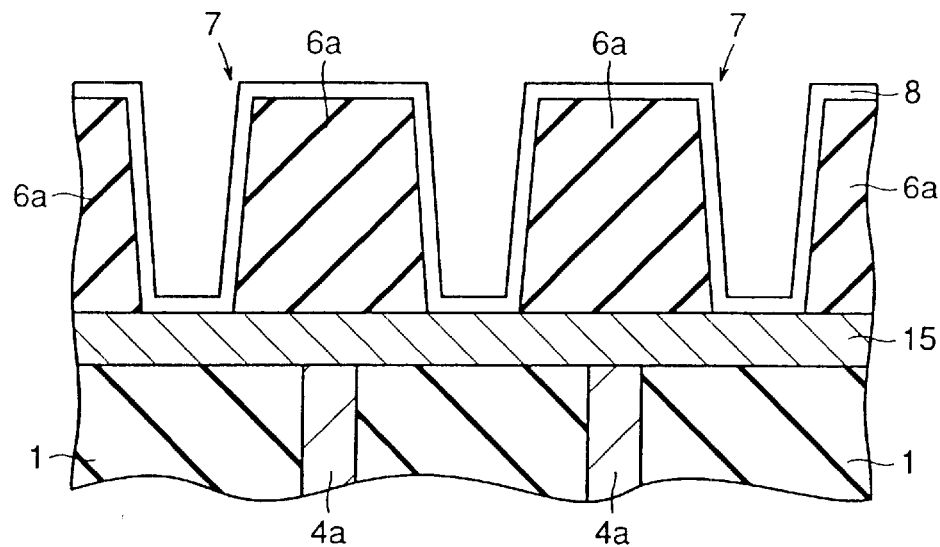
FIG. 9 is a cross section at the step of depositing a non-doped amorphous silicon film in the FIG. 8 condition.
Figure 10:
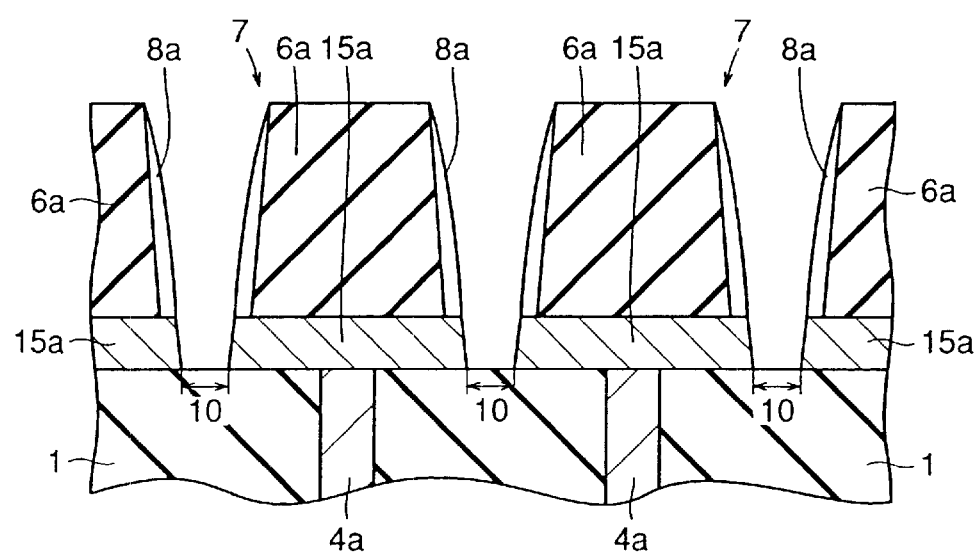
FIG. 10 is a cross section at the step of anisotropically etching an entire surface in the FIG. 9 condition.
Figure 11:
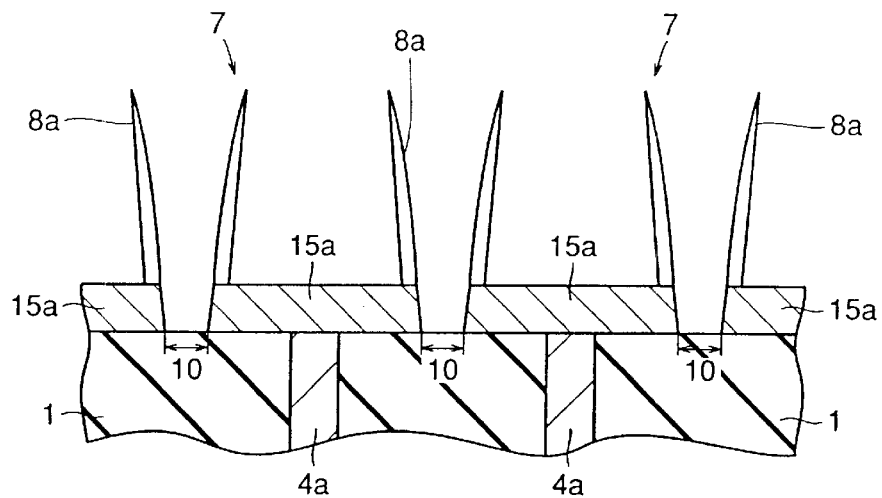
FIG. 11 is a cross section at the step of anisotropically etching the FIG. 10 condition and removing BPTEOS surrounded by a cylindrical upper portion of a cylindrical storage node.
Figure 12:
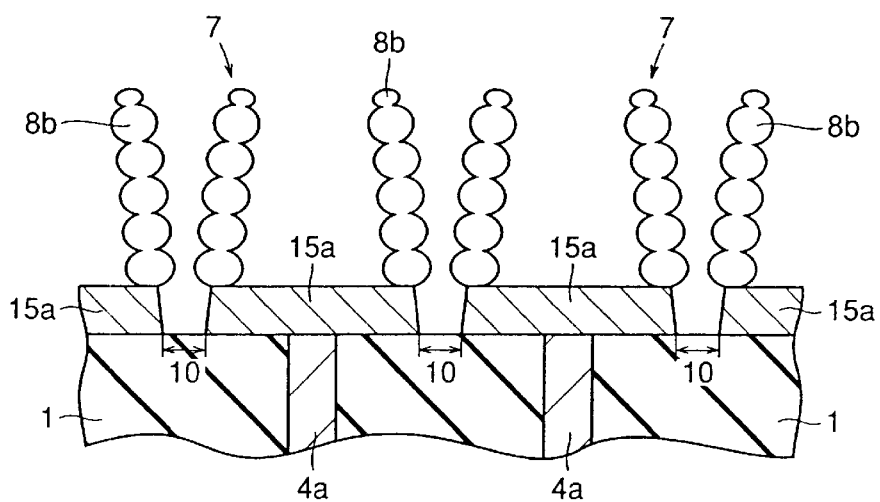
FIG. 12 is a cross section at the step of roughening a surface of the cylindrical upper portion of the storage node in the FIG. 11 condition.

Then, in the FIG. 8 condition, non-doped amorphous silicon 8 is deposited, as shown in FIG. 9 and non-doped amorphous silicon film 8 then has an entire surface anisotropically etched. Then, cylindrical, non-doped amorphous silicon film 8a is used as a mask to anisotropically etch metal film 15 (FIG. 10). Then, vapor-phase HF is employed to selectively etch BPTEOS 6a surrounded by cylindrical, non-doped amorphous silicon 8a (FIG. 11). Then the same method as employed in the first embodiment is employed to provide a rough surface (FIG. 12). Metal film 15a, forming a lower portion of the storage node, is substantially free of silicon and it would not have a surface with silicon growing thereon. This ensures that spacing 10 between storage nodes can further be increased than in the first embodiment providing a storage node having lower portion 5a of phosphorus-doped polycrystalline silicon. Thus a capacitor can have an increased capacitance, as in the semiconductor device of the first embodiment, and in addition a short-circuit margin can be provided with storage nodes further be spaced. Furthermore the metal film is smaller in resistance than doped polycrystalline silicon and a low-resistance contact with an underlying wiring can thus be provided.

Third Embodiment

Figure 13:
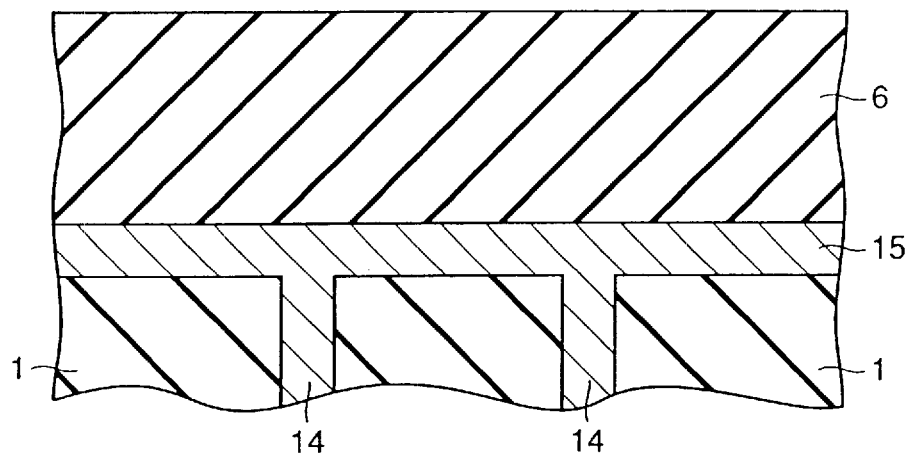
FIG. 13 is a cross section illustrating a method of manufacturing a semiconductor device in a third embodiment of the present invention at the step of using Ti/TiN/Ti to form a plug interconnection and a lower layer of a storage node and depositing BPTEOS.
Figure 14:
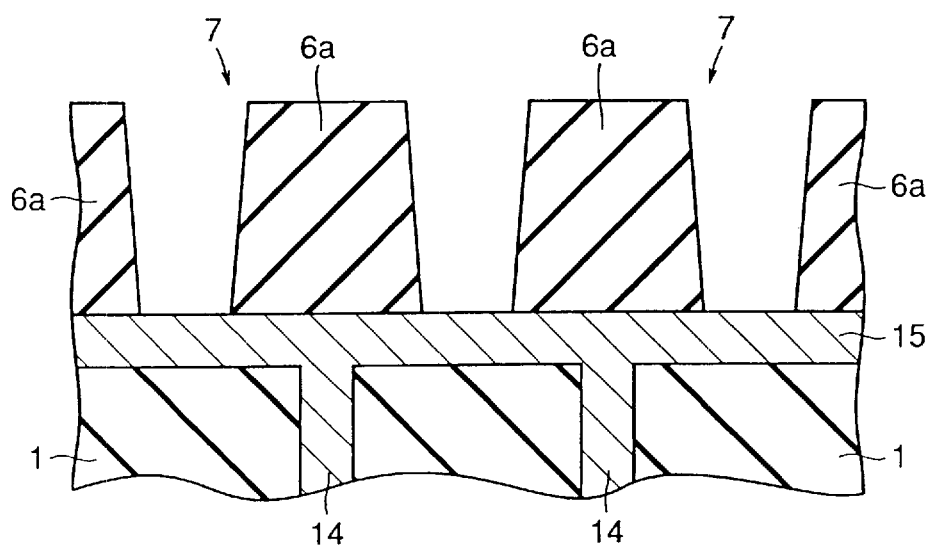
FIG. 14 is a cross section at the step of patterning BPTEOS in the FIG. 13 condition to form an upper portion of a storage node.
Figure 15:
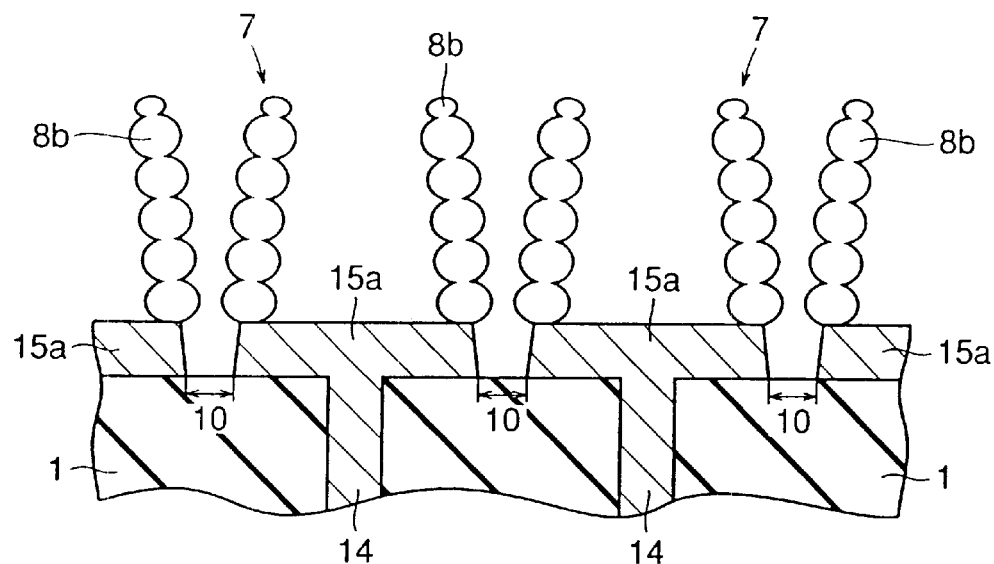
FIG. 15 is a cross section at the step of forming a cylindrical upper portion of the storage node in the FIG. 14 condition and roughening a surface.

FIGS. 13–15 show a method of manufacturing a semiconductor device in a third embodiment of the present invention. In the present embodiment the plug interconnection is also formed of a metal film 14. The metal film can for example be Ti/TiN/Ti. In the present embodiment, metal film 14 is deposited in a contact hole of a storage node and successively a metal film 15 is deposited as a lower layer of the storage node (see FIG. 13). Conventionally, after a conductive film is deposited in a contact hole of a storage node an interlayer insulating film and a plug interconnection then have an entire surface anisotropically etched to leave the conductive film only in the plug interconnection. In the present embodiment the step of anisotropically etching an entire surface of the interlayer insulating film and the plug interconnection can be dispensed with.

On lower layer 15 of the storage node, BPTEOS 6 is deposited as an insulating deposited layer (FIG. 13) and a resist mask is used to pattern only BPTEOS 6 to form a pattern 6a of an upper portion of the storage node (FIG. 14). In patterning BPTEOS 6, metal film 15 is not etched. Then, as in the second embodiment, non-doped amorphous silicon 8 is deposited and then has an entire surface anisotropically etched. Furthermore, metal film 15 exposed between storage nodes 7 is anisotropically etched to expose interlayer insulating film 1 thereunder (see FIG. 15). Then, BPTEOS 6a surrounded by cylindrical, non-doped amorphous silicon 8a is selectively etched by vapor-phase HF. Then, the same method as employed to provide a rough surface in the first embodiment, is employed to roughen a surface of cylindrical, non-doped amorphous silicon 8a (FIG. 15). As shown in FIG. 15, the storage node has a lower portion free of a rough side surface and only non-doped amorphous silicon 8 has a rough surface, and short-circuit margin 10 is thus the same as in the second embodiment. Thus it is substantially larger than in the first embodiment.

In the present embodiment, as well as the second embodiment, a further increased capacitance of a capacitor can be ensured and in addition a margin preventing short-circuit between storage nodes can further be ensured. In addition, plug interconnection 2 and the lower layer of the storage node can be formed successively in a single step to reduce the number of steps. Furthermore, the plug interconnection formed of metal film allows the resistance of a contact with an underlying wiring to be smaller than when it is formed of phosphorus-doped polycrystalline silicon. Any interface is not provided between the plug interconnection and the lower portion of the storage node and a low-resistance contact with an underlying wiring can thus be provided. In the present embodiment if a contact hole of a storage node has an opening with a diameter no more than 0.1 µm it can be filled with a metal film having a thickness of approximately 0.05 to 0.1 µm. Thus a metal film on underlying TEOS 1 can have a thickness of the same level as when phosphorus-doped polycrystalline silicon is conventionally used, falling within a desirable range.

Fourth Embodiment

Figure 16:
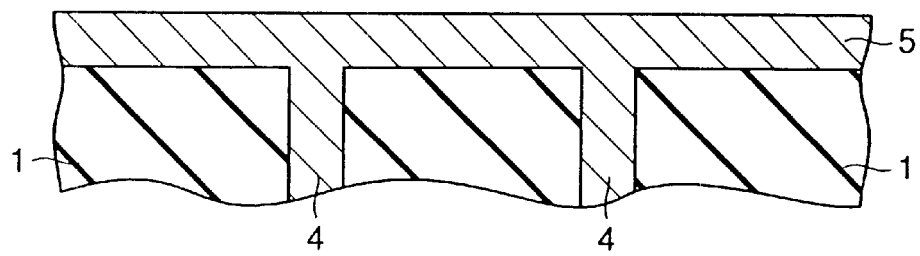
FIG. 16 is a cross section illustrating a method of manufacturing a semiconductor device in a fourth embodiment of the present invention at the step of forming a plug interconnection and a lower layer of a storage node that are formed of doped, polycrystalline silicon.
Figure 17:
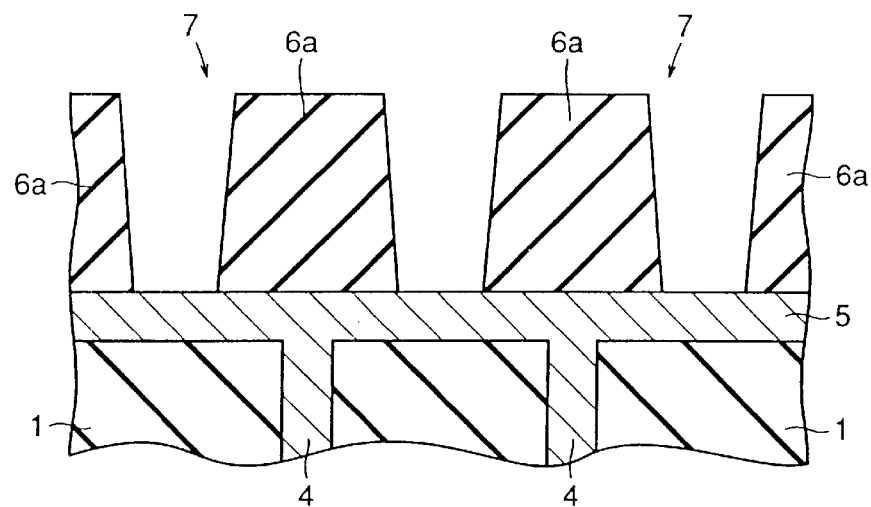
FIG. 17 is a cross section at the step of depositing and patterning BPTEOS in the FIG. 16 condition to form an upper portion of the storage node.
Figure 18:
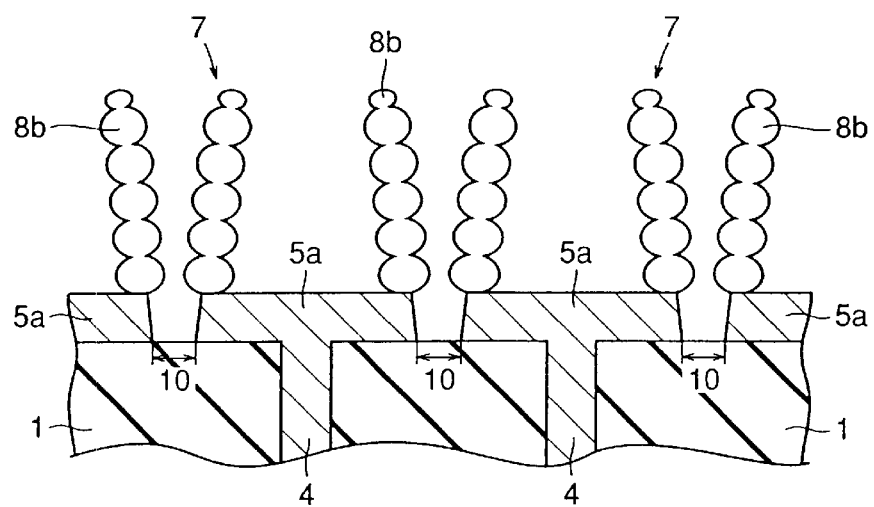
FIG. 18 is a cross section at the step of forming an upper portion of the storage node in a cylinder and roughening a surface thereof.

FIGS. 16–18 show a method of manufacturing a semiconductor device in a fourth embodiment of the present invention. In the present embodiment, doped amorphous silicon is deposited to fill a contact hole of a storage node. In filling the contact hole, doped amorphous silicon film is also deposited successively on interlayer insulating film 1. Normally, as shown in FIG. 16, doped amorphous silicon is also deposited on the interlayer insulating film to completely fill the contact hole and it accordingly then has an entire surface anisotropically etched away before a lower layer of the storage node is formed. In the present embodiment, however, it is used as the lower layer of the storage node and it thus remains, without having an entire surface anisotropically etched. The doped amorphous silicon filling the contact hole of the storage node and that serving as the lower portion thereof are then both thermally treated and thus crystallized to be doped polycrystalline silicon.

BPTEOS 6 is then deposited on doped polycrystalline silicon film 5 and a resist mask (not shown) is then used to etch only BPTEOS 6 in pattern 6a of storage node 7. Doped polycrystalline silicon layer 5 is not etched and thus remains. Then, as in the first embodiment, non-doped amorphous silicon film 8 is deposited in the FIG. 17 condition. Then, non-doped amorphous silicon film 8 and doped polycrystalline silicon film 5 have an entire surface anisotropically etched, while the non-doped amorphous silicon of a side surface of an upper portion of the storage node is not etched. BPTEOS 6a surrounded by cylindrical, non-doped amorphous silicon 8a is then selectively etched by vapor-phase HF to form an upper portion of the storage node that is formed of cylindrical, non-doped amorphous silicon. A surface roughening process is then carried out. Thus the storage node only has an upper portion provided with a rough surface while it has a lower portion prevented from having it (FIG. 18).

In the present embodiment the same effect as in the first embodiment can be achieved and in addition a plug interconnection and a lower portion of a storage node can be integrally provided to reduce the number of process steps. Furthermore an interface between the plug interconnection and the lower portion of the storage node can be eliminated and the resistance of a contact with an underlying wiring can thus be smaller than when the interface exists.

In the present embodiment if a contact hole of a storage node has an opening with a diameter no more than 0.1 µm then it can be filled with doped polycrystalline silicon having a thickness of approximately 0.05 to 0.1 µm. Thus, doped polycrystalline silicon on interlayer insulating film 1 of TEOS can desirably have a thickness of the same level as that of lower portion 5a of a storage node that is formed of doped polycrystalline silicon conventionally.

Fifth Embodiment

Figure 19:
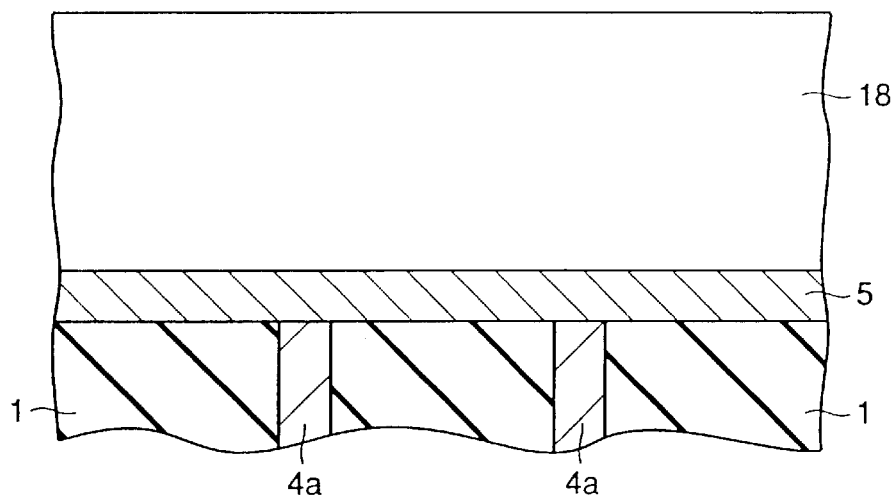
FIG. 19 is a cross section illustrating a method of manufacturing a semiconductor device in a fifth embodiment of the present invention at the step of depositing non-doped amorphous silicon on the lower layer of the storage node.
Figure 20:
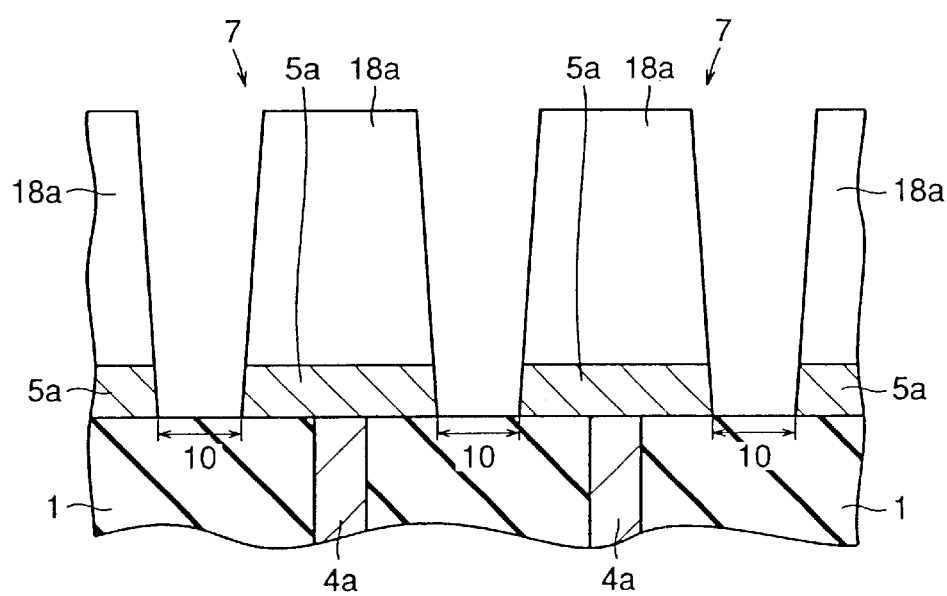
FIG. 20 is a cross section at the step of patterning the non-doped amorphous silicon and the lower layer of the storage node in the FIG. 19 condition to form the storage node.
Figure 21:
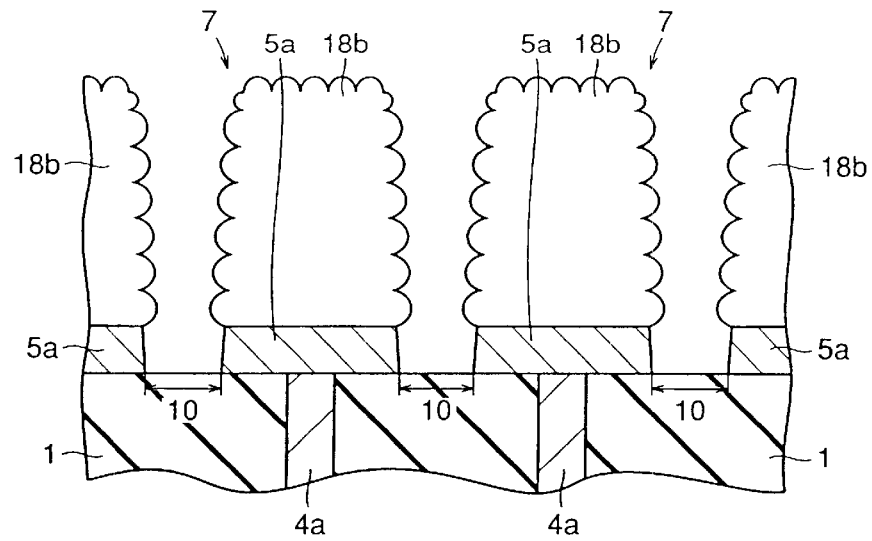
FIG. 21 is a cross section at the step of roughening a surface in the FIG. 20 condition.

FIGS. 19–21 show a method of manufacturing a semiconductor device in a fifth embodiment of the present invention. In the present embodiment the semiconductor device is provided with a thick film-stacked capacitor. As shown in FIG. 19, plug interconnection 4a and lower layer 5 of a storage node that is formed of doped polycrystalline silicon are provided and then on the lower layer of the storage node a non-doped amorphous silicon layer 18 is provided. Then a resist mask (not shown) is used to pattern non-doped amorphous silicon 18 and doped polycrystalline silicon film 5 to form an upper portion 18a of the storage node (FIG. 20). In this patterning step the storage node also has lower layer 5 etched to form lower portion 5a of the storage node and thus separate storage nodes from each other. Then a surface roughening process is carried out and, as shown in FIG. 21, only the non-doped amorphous silicon has a surface roughened to form an upper portion 18b of the storage node, whereas lower portion 5a of the storage node has a side surface prevented from having a rough surface. This ensures that margin 10 preventing short-circuit between storage nodes can be larger than conventional.

Then, to prevent depletion as the non-doped amorphous silicon remains as it is, the surface roughening process as described above is followed by introducing $PH_3$ to dope the non-doped amorphous silicon with phosphorus to prevent depletion. Doping the non-doped amorphous silicon with phosphorus is also desirable since a low resistance is required for a bottom electrode for the capacitor. Then a capacitance insulating film and a cell plate (a top electrode of the capacitor) are deposited to complete the capacitor.

Figure 22:
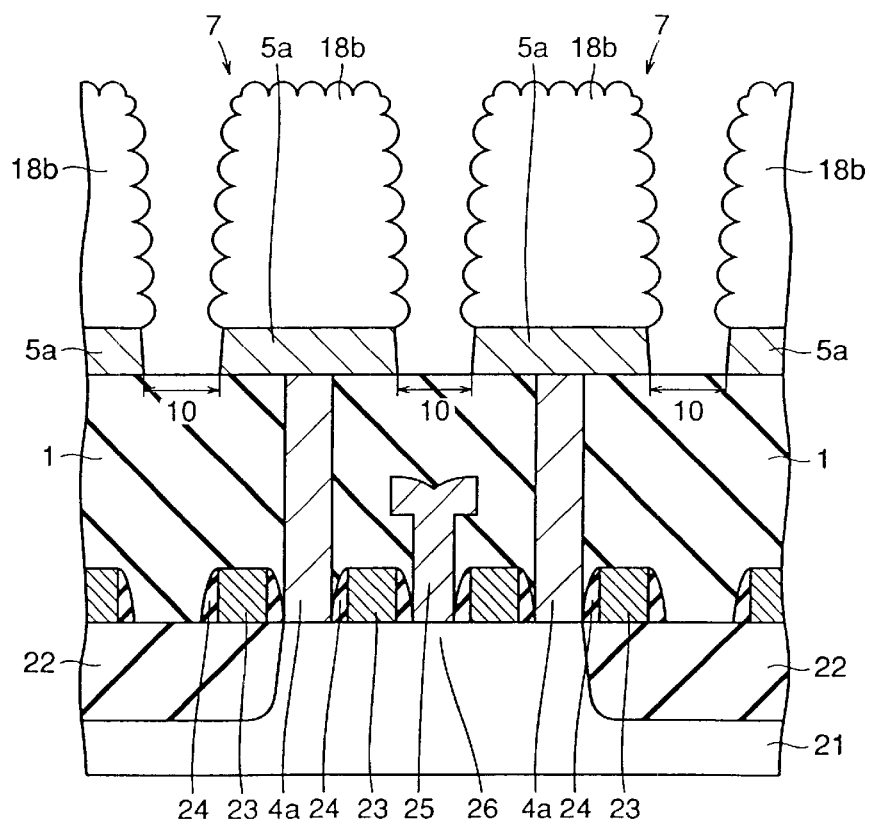
FIG. 22 is a cross section showing the upper portion of the storage node together with an underlying wiring in the fifth embodiment of the present invention.

FIG. 22 shows a portion of a semiconductor device that includes a capacitor and an underlying region. In FIG. 22 a semiconductor substrate 21 has an active region in a region surrounded by a separating oxide film 22 and on the active region and the separating oxide film are arranged a bit line 25 and a word line 23 covered with a side wall oxide film 24. Bit line 25 is connected to the active region via a bit line contact 26. The storage node has upper portion 8b connected to a predetermined active region or wiring via lower portion 5a of the storage node and plug interconnection 4a.

Such microfabricated semiconductor devices can obtain a thick, stacked capacitor sufficiently large in capacitance and in addition ensures a sufficiently large, short-circuit preventing margin.

Sixth Embodiment

Figure 23:
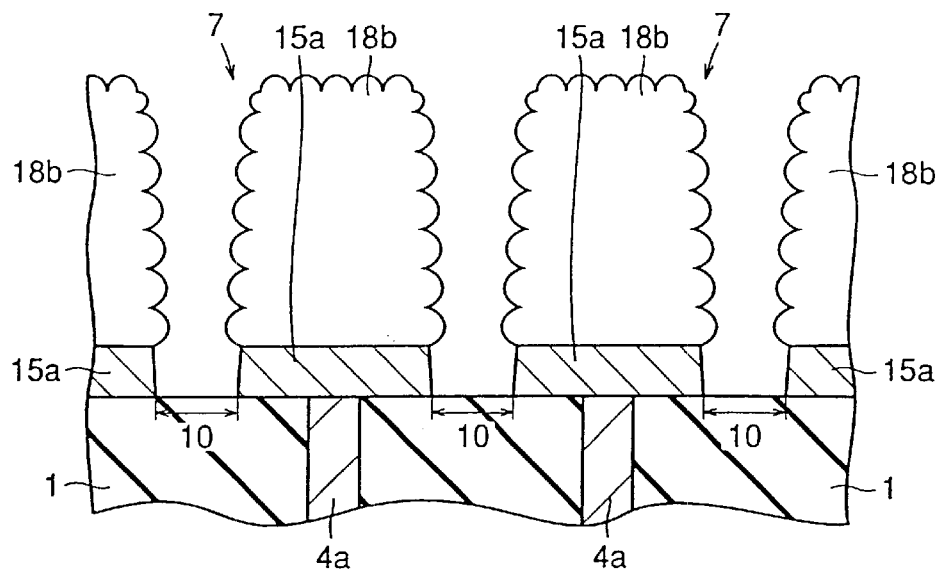
FIGS. 23–25 are cross sections showing semiconductor devices in sixth to eighth embodiments of the present invention.

FIG. 23 is a cross section of a semiconductor device in a sixth embodiment of the present invention. In the present embodiment a storage node has a lower portion formed of metal film 15a. The metal film can for example be Ti/TiN/Ti. The present semiconductor device can be manufactured by combining the first, second and fifth embodiments together.

The configuration as above can provide a capacitor with an increased capacitance and in addition further ensures a margin against short-circuit between storage nodes. Furthermore, metal film is smaller in resistance than doped polycrystalline silicon and a low-resistance contact with an underlying wiring can thus be provided.

Seventh Embodiment

Figure 24:
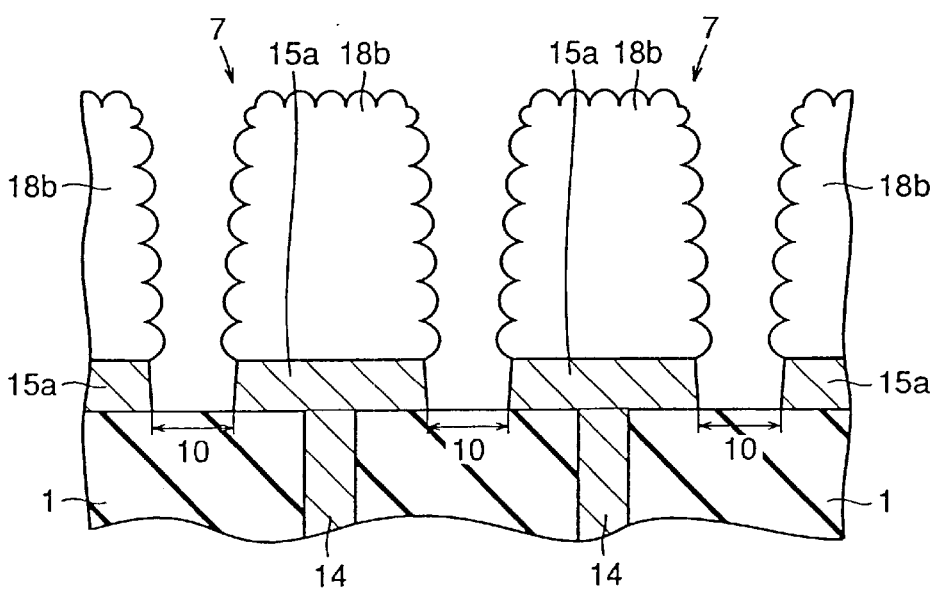

FIG. 24 shows a semiconductor device in a seventh embodiment of the present invention. The present semiconductor device has a plug interconnection 14 and a lower portion 15a of a storage node that are formed of a single metal film. As such, in a thick film-stacked capacitor an increased capacitance of a capacitor and an increased short-circuit margin are ensured and in addition are achieved a low resistance attributed to the metal film, a low-resistance contact with an underlying wiring that is attributed to the fact that there does not exist an interface between plug interconnection 14 and lower portion 15a of the storage node, and a reduced number of process steps attributed to providing the plug interconnection and the lower portion of the storage node successively.

Eighth Embodiment

Figure 25:
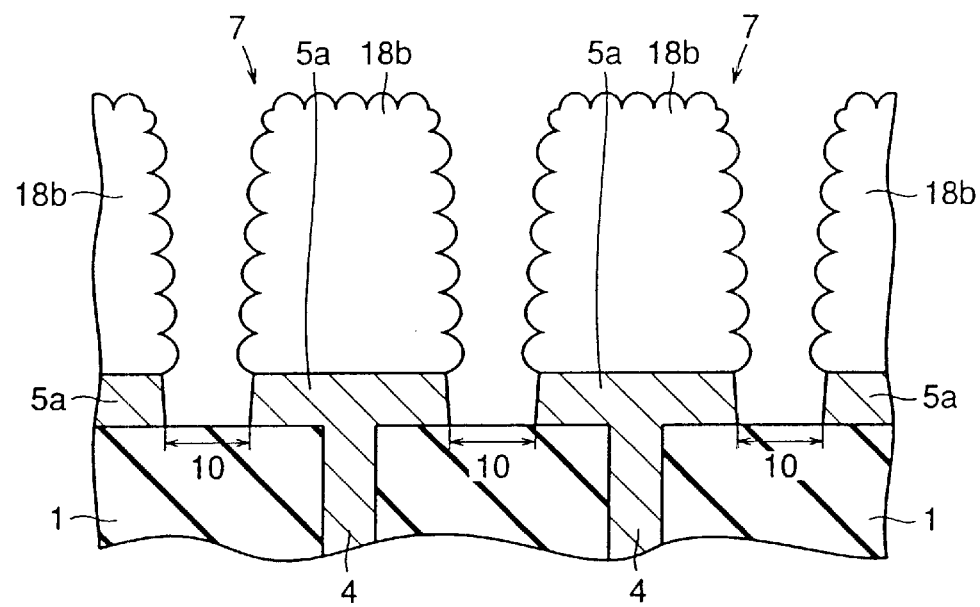
Figure 26:
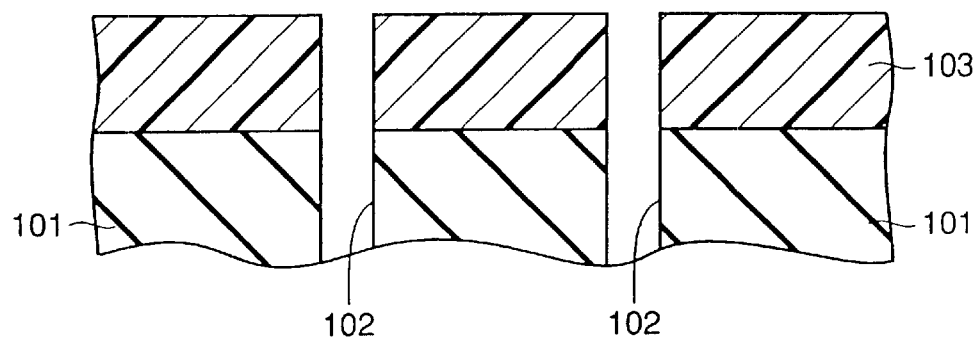
FIG. 26 illustrates a conventional method of manufacturing a semiconductor device at the step of providing a contact hole for a storage node.
Figure 27:
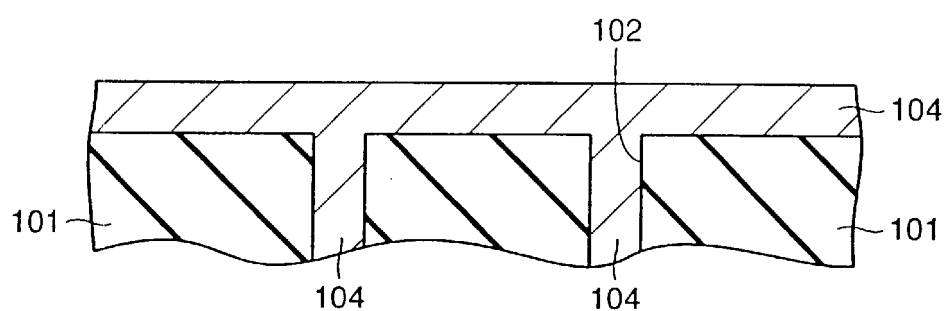
FIG. 27 is a cross section at the step of filling the contact hole for the storage node with conductive film in the FIG. 26 condition.
Figure 28:
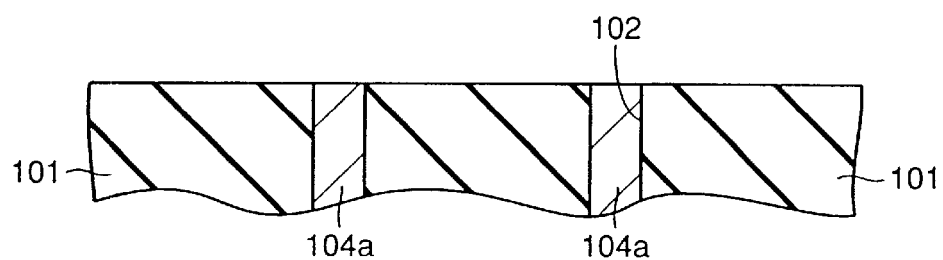
FIG. 28 is a cross section at the step of anisotropically etching an entire surface in the FIG. 27 condition.
Figure 29:
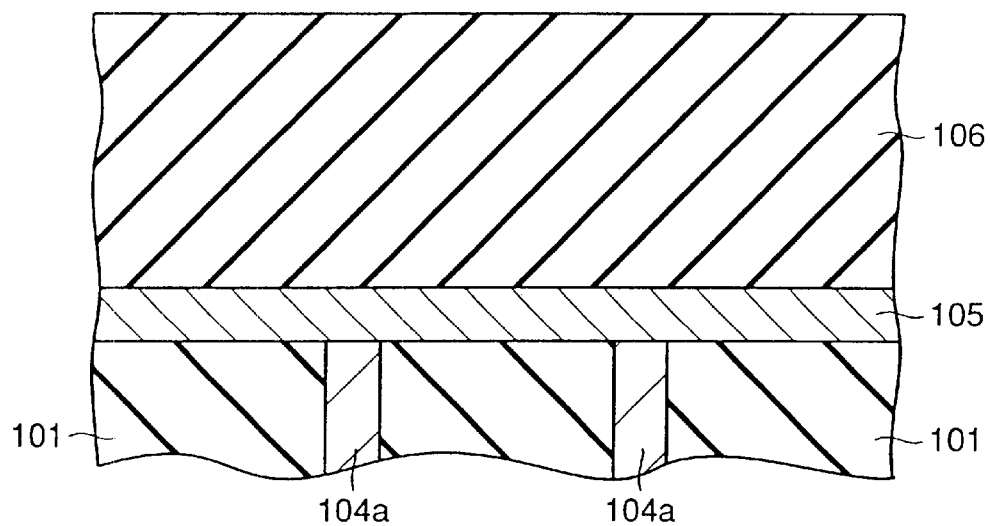
FIG. 29 is a cross section at the step of forming a lower layer of the storage node in the FIG. 28 condition.

FIG. 25 shows a semiconductor device in an eighth embodiment of the present invention. The present semiconductor device has plug interconnection 4 and lower portion 5a of a storage node that are formed of a single, doped polycrystalline silicon. This doped polycrystalline silicon is provided by depositing and thermally treating doped amorphous silicon to be polycrystalline.

The thick film-stacked capacitor as described above can have an effect similar to that of the semiconductor device of the fourth embodiment. That is, an increased capacitance of a capacitor and an increased short-circuit margin are ensured and in addition can be obtained a low-resistance contact with an underlying wiring that is attributed to the fact that there does not exist an interface between a plug interconnection and a lower portion of a storage node, and a reduced number of process steps attributed to providing the plug interconnection and the lower portion of the storage node successively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

providing a plug interconnection penetrating an insulating film formed to cover an underlying region including a semiconductor active region and an underlying wiring, to connect with said underlying wiring;

providing on said insulating film a lower layer of a storaged node connected to said plug interconnecton;

on said lower layer intact or on said lower layer with a predetermined pattern formed of an insulating film and arranged thereon, depositing an amorphous silicon film to be used to form an upper portion of said storage node;

patterning both said amorphous silicon film and said lower layer and thereby forming on said insulating film said storage node having a lower portion and said upper portion; and roughening a surface of said amorphous silicon film forming said upper portion, wherein:

the step of depositing an amorphous silicon film includes forming a pattern of a rod on said lower layer and depositing said amorphous silicon film on said lower layer and said pattern;

the step of patterning and thereby forming includes the step of anisotropically etching away said amorphous silicon film covering an upper surface of said pattern of said rod, said amorphous silicon film covering said lower layer, and said lower layer covered with said amorphous silicon film, while leaving said amorphous silicon film covering a side surface of said pattern of said rod, and removing said pattern of said rod having said upper surface exposed in the step of anisotropically etching, to form said upper portion formed of said amorphous silicon film provided in the form of a cylinder;

the step of forming a pattern of a rod includes providing a moisture-containing insulating film and patterning said moisture-containing insulating film in said rod; and the step of removing said pattern of said rod includes removing said moisture-containing insulating film through vapor-phase HF.

2. The method according to claim 1, wherein said insulating film penetrated by said plug interconnection is a moisture-free, tetra-ortho-silicate (TEOS) film and said insulating film forming said pattern of said rod is a moisture-containing, boro-phospho-tetra-ethyl-ortho-silicate (BPTEOS) film, and the step of removing said pattern of said rod includes removing said BPTEOS film through vapor-phase HF.

3. A method of manufacturing a semiconductor device, comprising the steps of:

providing a plug interconnecting penetrating an insulating film formed to cover an underlying region including a semiconductor active region and an underlying wiring, to connect with said underlying wiring;

providing on said insulating film a lower layer of a storage node connected to said plug interconnection;

on said lower layer intact or on said lower layer with predetermined pattern formed of an insulating film and arranged thereon, depositing an amorphous silicon film to be used to form an upper potion of said storage node;

patterning both said amorphous silicon film and said lower layer and thereby forming on said insulating film said storage node having a lower portion and said upper portion; and roughening a surface of said amorphous silicon film forming said upper portion, wherein:

the step of depositing an amorphous silicon film includes forming a pattern of a rod on said lower layer and depositing said amorphous silicon film on said lower layer and said pattern; and the step of patterning and thereby forming includes the step of anisotropically etching away said amorphous silicon film covering an upper surface of said pattern of said rod, said amorphous silicon film covering said lower layer, and said lower layer covered with said amorphous silicon film, while leaving said amorphous silicon film covering a side surface of said pattern of said rod, and removing said pattern of said rod having said upper surface exposed in the step of anisotropically etching, to form said upper portion formed of said amorphous silicon film provided in the from of a cylinder;

said insulating film penetrated by said plug interconnection is a moisture-free, tetra-ethyl-ortho-silicate (TEOS) film;

said insulating film forming said pattern of said rod is a moisture-containing boro-phospho-tetra-ethyl-ortho-silicate BPTEOS) film; and the step of removing said pattern of said rod includes removing said BPTEOS film through vapor-phase HF.

* * * * *